(12) United States Patent
Sabbah (10) Patent No.: US 8,934,310 B2
(45) Date of Patent: Jan. 13, 2015

(54) BITLINE FOR MEMORY

(71) Applicant: Micron Technology, Inc., Boise, ID (US)

(72) Inventor: Raed Sabbah, Rancho Cordova, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/964,749

(22) Filed: Aug. 12, 2013

(65) Prior Publication Data

US 2013/0343140 A1    Dec. 26, 2013

Related U.S. Application Data

(63) Continuation of application No. 12/772,147, filed on Apr. 30, 2010, now Pat. No. 8,509,013.

(51) Int. Cl.
| | | |
|---|---|---|
| G11C 7/00 | (2006.01) | |
| G11C 7/06 | (2006.01) | |
| G11C 7/08 | (2006.01) | |
| G11C 7/12 | (2006.01) | |
| G11C 7/18 | (2006.01) | |
| G11C 5/02 | (2006.01) | |

(52) U.S. Cl.
CPC .............. *G11C 7/062* (2013.01); *G11C 7/065* (2013.01); *G11C 7/08* (2013.01); *G11C 7/12* (2013.01); *G11C 7/18* (2013.01); *G11C 2207/005* (2013.01); *G11C 5/025* (2013.01)
USPC .......... 365/196; 365/202; 365/205; 365/207; 365/210.13; 365/154

(58) Field of Classification Search
CPC .. G11C 2207/002; G11C 7/1039; G11C 7/06; G11C 7/062
USPC ............. 365/196, 202, 205, 207, 210.13, 154
See application file for complete search history.

(56) References Cited

U.S. PATENT DOCUMENTS

| | | | |
|---|---|---|---|
| 5,917,744 A * | 6/1999 | Kirihata et al. | 365/63 |
| 6,317,355 B1 | 11/2001 | Kang | |
| 6,664,807 B1 | 12/2003 | Crotty et al. | |
| 2003/0095431 A1* | 5/2003 | Khalid | 365/185.03 |
| 2005/0232032 A1* | 10/2005 | Lee | 365/191 |
| 2009/0268540 A1 | 10/2009 | Rao et al. | |
| 2010/0290305 A1* | 11/2010 | Rao et al. | 365/227 |

OTHER PUBLICATIONS

USPTO; Office Action dated Sep. 24, 2012, from related U.S. Appl. No. 12/772,147, filed Apr. 30, 2010.

* cited by examiner

*Primary Examiner* — Han Yang
(74) *Attorney, Agent, or Firm* — Knobbe Martens Olson & Bear LLP (57) ABSTRACT

Subject matter disclosed herein relates to accessing memory, and more particularly to operation of a partitioned bitline.

12 Claims, 6 Drawing Sheets

BITLINE FOR MEMORY

CROSS-REFERENCE TO RELATED APPLICATION

This application is a continuation application of U.S. application Ser. No. 12/772,147, filed Apr. 30, 2010, now U.S. Pat. No. 8,509,013, the entirety of which is incorporated by reference herein.

BACKGROUND

1. Field

Subject matter disclosed herein relates to accessing memory, and more particularly to operation of a partitioned bitline.

2. Information

Memory devices may be employed in many types of electronic equipment, such as computers, cell phones, PDA's, data loggers, games, and navigational gear, for example. Continuing demand for smaller and/or more capable electronic equipment may lead to a desire for smaller, higher density memory devices, which may involve small semiconductor feature sizes that approach lower boundaries associated with material and electronic behavior at atomic or molecular levels. Accordingly, approaches to increase memory density other than decreasing semiconductor feature sizes may involve new configurations, new circuit layouts, and/or new approaches to operating memory components, for example.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Reference throughout this specification to "one embodiment" or "an embodiment" means that a particular feature, structure, or characteristic described in connection with an embodiment is included in at least one embodiment of claimed subject matter. Thus, appearances of the phrase "in one embodiment" or "an embodiment" in various places throughout this specification are not necessarily all referring to the same embodiment. Furthermore, particular features, structures, or characteristics may be combined in one or more embodiments.

In an embodiment, to provide an opportunity for relatively efficient integrated circuit packaging, a shape of a first memory device may be configured to physically fit well with an adjacent second memory or other component. Such adjacent memories may comprise memory types that are different from one another. For example, if a flash or dynamic random access memory (DRAM) comprises a relatively long and narrow shape, then an adjacent static random access memory (SRAM) may desirably comprise a similarly long and narrow shape. Herein, aspect ratio, defined as a ratio of length to width, may be used to describe such shapes. As described in further detail below, however, a memory device having such an aspect ratio may result in a number of constraints involving read/write access speed and/or routing of signals during a read/write access. For example, access speed may be relatively slow because of parasitic effects due to relatively large capacitance and/or resistance resulting from a relatively long bitline that is used to access relatively distant (e.g., from a memory controller) memory portions. Additionally, access speed may also be slow due to signals representing read/write information travelling relatively long bitlines. As storage capacity of such a high aspect ratio memory device increases, so may the significance of such constraints.

In a particular implementation, a technique for reducing such problematic effects resulting from a high aspect ratio shape may involve partitioning a bit line into two portions or segments. Such individual bitline segments may be respectively associated with an upper and a lower portion of a memory device. Such memory portions may comprise an upper sub-array of memory cells and a lower sub-array of memory cells. Though terms "upper" and "lower" are used herein, it is understood that such terms do not necessarily refer to a direction defined by gravity or any other particular orientation. Instead, such terms are merely used to identify one portion versus another portion. Accordingly, "upper" and "lower" may be equivalently interchanged with "top" and "bottom", "first" and "second", "right" and "left", and so on. Claimed subject matter is not limited to any particular direction or orientation. Continuing to describe an embodiment of a memory device, such individual bitline segments may be characterized as having approximately half the line resistance and/or capacitance compared to that of a non-partitioned bit line. Such a reduction may further lead to a reduction of an RC-constant for individual partitioned bitlines by a factor of four, resulting in bitline signal development that may be four times faster than that of a non-partitioned bitline. Accordingly, embodiments of memory devices described herein may provide a number of benefits including improved memory access speed. Of course, such a benefit of improved speed is merely an example, and claimed subject matter is not so limited.

In a particular implementation, a memory device including such a partitioned bitline may be characterized as having an upper sub-array associated with an upper bitline and a lower sub-array associated with a lower bitline. Herein, it is understood that a bitline may comprise a bitline pair: a bitline and a complement bitline) During a read process, for example, signals on an upper bitline resulting from read memory cells of an upper sub-array may be sensed using an upper sense amplifier. Signals generated by such a sensing process in the upper bitline may be routed from the upper sense amplifier to the lower bitline, where the signals may be sensed again using a lower sense amplifier. Such a process of double-sensing may provide a benefit of improving speed of a read process. One reason for such an improved speed may be because the upper sense amplifier may produce a differential output that need not be fully pulled down for a sensing process by the lower sense amplifier, which may relatively slow, adding extra sensing time.

In another particular implementation, two such stages of sense amplification need not involve an extra bitline pair.

Instead, merely a single bitline pair (e.g., a bitline and a complement bitline) may be used for both read and write process. In yet another particular implementation, a memory device, as described above, may comprise a SRAM having a relatively high aspect ratio. Of course, such details of bitline and memory device configuration are merely examples, and claimed subject matter is not so limited.

In another particular implementation, a dynamic sense amplifier may be used to sense a state of a memory cell via a bitline. Because such a dynamic sense amplifier may latch a wrong state if enabled too soon, a waiting period may be included in a sense process. Subsequent to a waiting period, a dynamic sense amplifier may be enabled. Such a waiting period may allow falling voltage on a bitline enough time to reach a relatively low voltage to overcome a variety of issues that may adversely affect bitline sensing. For example, such issues may include uncertainties related to memory device parameters (e.g., mismatching memory devices), impact of alpha particles on portions of a memory device, and timing inaccuracies, just to name a few examples. In a particular implementation, such a relatively low voltage to overcome such issues may be about 100 millivolts (mV). For example, in a read process, a bitline voltage drop to about 100 mV may be carried out by discharging a relatively large bit line capacitor through a relatively large resistance. If a bitline is partitioned as described above, resistor-capacitor constant (RC) may be reduced by a factor of four so that a voltage of about 100 mv may be reached relatively fast. As a result, a top sense amplifier may be enabled relatively fast, thus producing a relatively fast sense signal at its output.

Such a sense signal produced by a top sense amplifier may be driven by a full driver inverter at the output of the sense amplifier. Such a driver may drive an impedance of a bottom portion of a partitioned bitline. However, such impedance need not be large since a lower sense amplifier may sense a differential signal so that a relatively low voltage of 100 mV may be reached relatively quickly. Thus, a bottom sense amplifier may be enabled relatively quickly. Accordingly, for a read process, a partitioned bitline may be faster than a non-partitioned bitline if reading time is at least partially determined by a time for the bitline to drop to about 100 mV, for example. Reducing such a time by a factor of four for a partitioned bitline with respect to a non-partitioned bitline may result in such a faster read speed.

In an embodiment, a process of reading or writing from/to a memory device may involve a memory access request (e.g., by a memory controller and/or processor) for a particular address of the memory device. In detail, such a process may comprise determining whether a memory access request is addressed to a lower sub-array of memory cells which are addressable via a lower bitline or an upper sub-array of memory cells, which are addressable via an upper bitline. Upon a determination that a memory access request is addressed to the upper sub-array, a read/write process may further comprise activating a lower sense amplifier to receive signals from the lower bitline and activating an upper sense amplifier to receive signals from the upper bitline. Such signals on the upper bitline may result from a process of reading from the upper sub-array, for example. Such signals on the upper bitline may also be based, at least in part, on signals on the lower bitline resulting from a process of writing to the upper sub-array. However, upon a determination that the memory access request is addressed to the lower sub-array, a read/write process may further comprise activating the lower sense amplifier to receive signals from the lower bitline and de-activating the upper sense amplifier. In an implementation, upper and lower sub-arrays of memory cells may comprise SRAM cells. Of course, such details of a read/write process are merely examples, and claimed subject matter is not so limited.

Though a number of configurations are possible, in a particular embodiment, a memory device may comprise a lower sub-array of memory cells which are addressable via a lower bitline, an upper sub-array of memory cells which are addressable via an upper bitline, and a sense amplifier repeater (SAR) circuit electronically interconnecting lower and upper sub-arrays. Such an SAR circuit, acting as a driver, may amplify signals on the upper bitline, wherein such signals may result from a process of reading from the upper sub-array. Such an SAR circuit may also place amplified signals onto the lower bitline. For example, an SAR circuit may repeat a lower bitline signal into the upper bitline portion in the case of writing to the upper sub-array of memory cells. On the other hand, an SAR circuit may sense a bitline differential signal from the upper bitline portion and repeat the differential signal, amplifying the signal onto the lower bitline. In a particular implementation, such a memory device may further comprise a lower sense amplifier to receive sensed-amplified signals from a lower bitline. In another particular implementation, an upper and lower bitline may comprise a single bitline partitioned by an SAR circuit. For example, such a single bitline may comprise a continuous conductive line that is partitioned by an SAR circuit, partitioning the bitline into upper and lower bitlines. Accordingly, such an SAR circuit may act as a driver to strengthen signals carried by upper and lower bitlines that, in combination, are relatively long. In another particular implementation, such a memory device may comprise a SRAM. Of course, such details of a memory device are merely examples, and claimed subject matter is not so limited.

Figure 1:
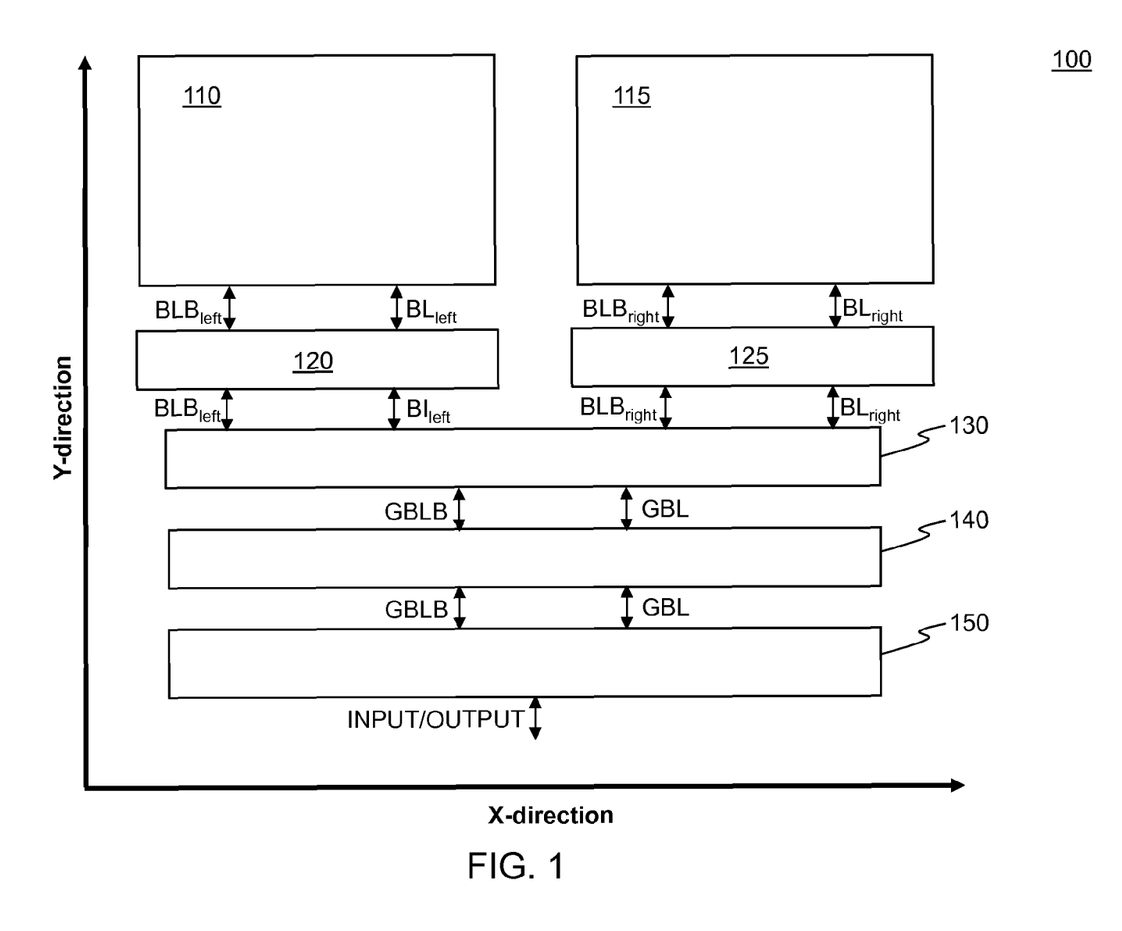
FIG. 1 is a schematic block diagram of memory structure, according to an embodiment.

FIG. 1 is a schematic block diagram of a structure of a memory device 100, according to an embodiment. Such a structure may be described in terms of relative height and width in a Y direction and X direction as shown in FIG. 1, for example. For illustrative purposes, memory device 100 may have a relatively small aspect ratio, wherein height and width of memory device 100 may be substantially similar to one another and/or height may be substantially less than width. Such a relatively small aspect ratio will be compared below with that of memory device 300 shown in FIG. 3. As explained above, a memory device having such a relatively small aspect ratio may not physically fit well with an adjacent memory device (shown in FIG. 2, for example) having a relatively large aspect ratio (e.g., relatively tall and narrow). For example, a memory cell array of memory device 100 may occupy a relatively wide area compared with a depth of memory device 100. In one implementation, such a memory cell array may comprise a left sub-array 110 and a right sub-array 115. In a particular example, left sub-array 110 and right sub-array 115 may each comprise 2048 rows of memory cells and 256 columns of memory cells, wherein an individual memory cell may be three microns wide and one micron tall. In another particular example, left sub-array 110 may comprise 2048 rows of memory cells and 256 columns of memory cells and right sub-array 115 may comprise 2048 rows of memory cells and 128 columns of memory cells, though claimed subject matter is not limited in this respect.

Though not shown, memory device 100 may include additional portions of a memory cell array, and claimed subject matter is not limited in this respect. Also, though terms "left" and "right" are used herein, it is understood that such terms do not necessarily refer to a direction defined by gravity or any other particular orientation. Instead, such terms are merely used to identify one portion versus another portion. Accordingly, "left" and "right" may be equivalently interchanged with "top" and "bottom", "first" and "second", "upper" and "lower", and so on. Claimed subject matter is not limited to any particular direction or orientation. Returning to describing memory device 100, left sub-array 110 and a right sub-array 115 may be located adjacent to one another (e.g., in an X direction) so that parallel bitlines may be used to access the sub-arrays. Such parallel bitlines may be relatively short, having a length of approximately 500 microns, for example. In particular, a left bitline pair may be used to access left sub-array 110 and a right bitline pair may be used to access right sub-array 115. Such bitline pairs may comprise a bitline BL to carry electronic signals during a process of accessing memory cells and a complementary bitline BLB to carry an inverse or complement of such signals, for example.

In an implementation, bitline precharge circuit 120 may precharge electrical signals on the left bitline pair and bitline precharge circuit 125 may precharge electrical signals on the right bitline pair. Multiplexer 130 may be used to select among left and right bitline pairs, wherein a selected bitline pair may be electrically connected to a global bitline pair GBL and GBLB. A sense amplifier precharge circuit 140 may be used to precharge electrical signals on global bitline pair GBL and GBLB. I/O write circuit and sense amplifier 150 may comprise an input/output port for electrical signals resulting from a memory access process, such as read/write processes, for example. I/O write circuit and sense amplifier 150 may also comprise a sense amplifier to sense electrical signals on global bitline pair GBL and GBLB. Of course, such details of structure of a memory device are merely examples, and claimed subject matter is not so limited.

Figure 2:
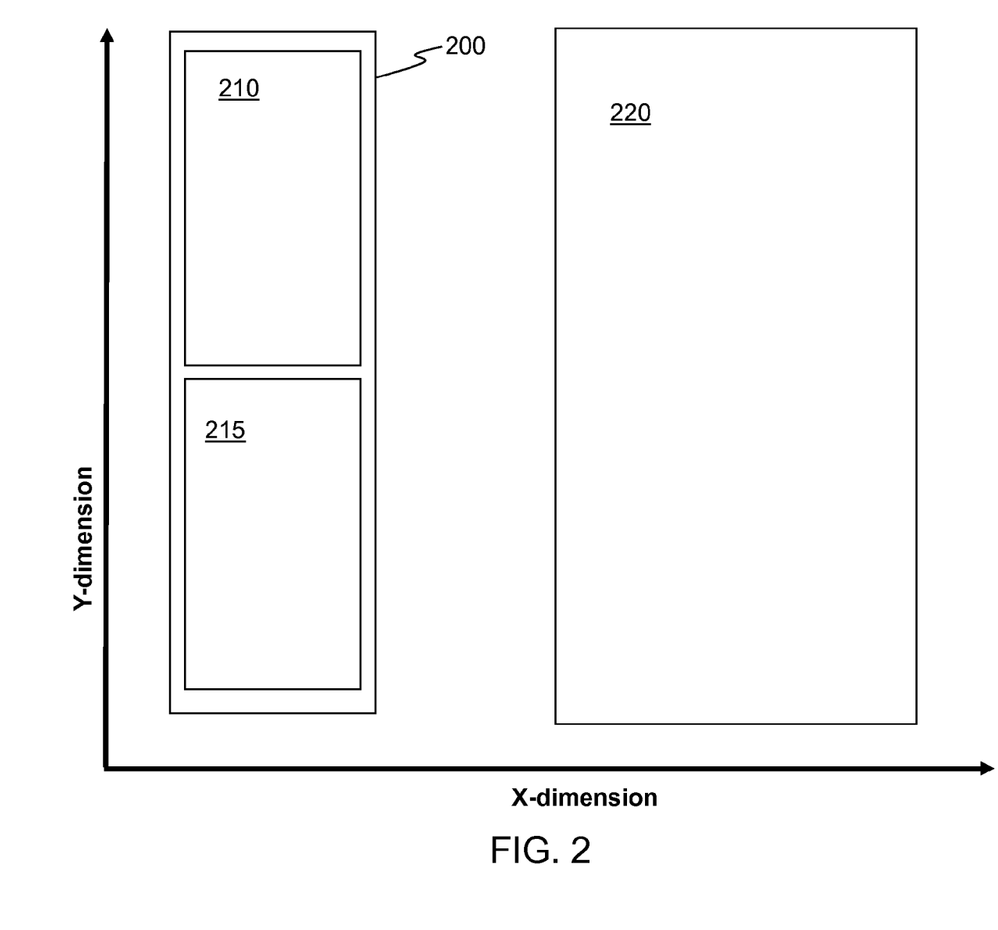
FIG. 2 is a schematic block diagram of adjacent memory structures, according to an embodiment.

FIG. 2 is a schematic block diagram of adjacent memory structures, according to an embodiment. Such structures may be described in terms of relative height and width in a Y direction and X direction, as shown in FIG. 2 for example. Memory device 200 may comprise a first memory structure and memory device 220 may comprise a second memory structure. For example, memory device 200 may comprise an SRAM and memory device 220 may comprise a DRAM, SRAM, Flash, and/or other type of memory. Memory device 200 and memory device 220 may be adjacent to one another with or without other intervening structures and/or components. In an implementation, memory device 200 may be configured to have a relatively large aspect ratio to substantially match a length of adjacent memory device 220. Matching lengths of memory devices may provide a benefit of improving space utilization of a memory package that includes memory device 200 and memory device 220, for example. Memory device 200 may be partitioned into an upper sub-array 210 of memory cells and a lower sub-array 215 of memory cells. In one embodiment, input and/or out signals via bitline pairs (not shown) to/from upper sub-array 210 and lower sub-array 215 may multiplexed in a fashion similar to that shown in FIG. 1, where multiplexer 130 may be used to select among bitline pairs. However, such bit lines pairs may be relatively long to accommodate memory device 200 having a relatively high aspect ratio. As mentioned above, a capacitance and/or resistance for such long bit line pairs may be relatively high, resulting in a relatively slow precharge process, for example. In another embodiment, bitline pairs (not shown) to/from upper sub-array 210 and lower sub-array 215 may be partitioned into two portions or segments. As described above, such individual bitline segments may be respectively associated with upper sub-array 210 and lower sub-array 215, respectively. Such individual bitline segments may be characterized as having approximately half the line resistance and/or capacitance compared to a non-partitioned bit line. Of course, such details of memory device structures are merely examples, and claimed subject matter is not so limited.

Figure 3:
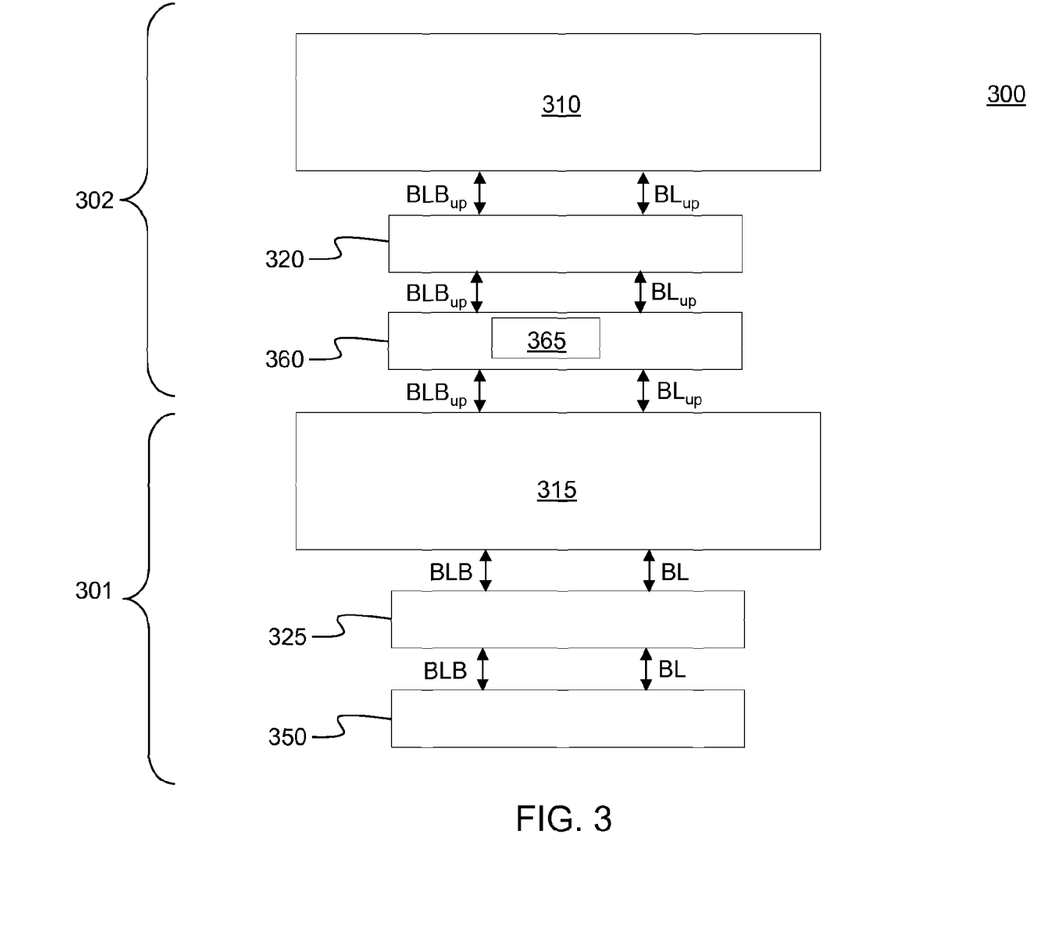
FIG. 3 is a schematic block diagram of memory structure, according to another embodiment.

FIG. 3 is a schematic block diagram of a memory device 300, according to an embodiment. Memory device 300 may comprise a lower memory portion 301 and an upper memory portion 302. Further, lower memory portion 301 may comprise lower sub-array 315 of memory cells which are addressable via a lower bitline pair BL/BLB. Similarly, upper memory portion 302 may comprise and an upper sub-array 310 of memory cells which are addressable via an upper bitline pair $BL_{up}$/$BLB_{up}$. Hereinafter, for sake of simplicity, lower bitline pair BL/BLB will be referred to as lower bitline BL and upper bitline pair $BL_{up}$/$BLB_{up}$ will be referred to as upper bitline $BL_{up}$. Memory device 300 may also comprise an SAR circuit 360 to electronically interconnect lower and upper sub-arrays. SAR circuit 360 may provide repeater signals in directions to and from upper sub-array 310. In particular, signals on upper bitline $BL_{up}$ travelling from lower memory portion 301 to upper sub-array 310 may be received, amplified, and re-transmitted back onto upper bitline $BL_{up}$ by SAR circuit 360. In the other direction, signals on upper bitline $BL_{up}$ travelling from upper sub-array 310 to lower memory portion 301 may be received, amplified, and re-transmitted onto lower bitline BL by SAR circuit 360. Such signal amplifying/repeating by SAR circuit 360 may provide a benefit of strengthening signals on upper bitline $BL_{up}$. Such signals may otherwise be relatively weak after travelling a relatively long distance along lower bitline BL to/from upper bitline $BL_{up}$.

Such an SAR circuit may comprise an upper sense amplifier 365 to amplify (e.g., drive) signals on upper bitline $BL_{up}$, wherein such signals may result from a process of reading from upper sub-array 310, for example. SAR circuit 360 may also place amplified signals onto lower bitline BL, as described in detail below in reference to FIG. 6. Further, SAR circuit 360 may provide circuitry (not shown) to prevent upper memory portion 302 from being accessed during a read/write process involving lower sub-array 315.

In a particular implementation, memory device 300 may further comprise a lower sense amplifier 350 to receive sensed-amplified signals from lower bitline BL. Lower sense amplifier 350 may also comprise I/O ports to receive and/or transmit signals involving read/write process directed to either lower memory portion 301 or upper memory portion 302. An upper precharge circuit 320 may precharge upper bitline signals before or during a process of read/write access to a memory cell in upper sub-array 310, while a lower precharge circuit 325 may precharge lower bitline signals during a process of reading a memory cell in lower sub-array 315. In addition, lower precharge circuit 325 may precharge signals provided to the lower bitline by SAR circuit 360 during a process of reading a memory cell in upper sub-array 310. In an implementation, a memory device may comprise more than one precharge circuit associated with bitlines and/or bitline portions. A number of precharge circuits may depend, at least in part, on bitline length and/or allotted precharge time for particular applications. In a particular implementation, memory device 300 may also comprise bitline isolation circuitry (not shown) to isolate sense amplifiers 365 and 350 during write access, isolating bitline during read for faster sensing. For example, bitlines and sense amplifier internal nodes may be isolated from one another in the case of a write process. Such isolation may result in reduced power consumption because sense amplifier internal nodes may remain unchanged. In another example, internal nodes of the sense amplifier and relatively large bitline capacitance may be isolated from one another in the case of a read process. In such a case, referring to an earlier example, ISO transistors may be switched off as soon as 100 mV bitline differentials have developed. Thus, sense amplifier switching speed may be increased. Of course, such details of a memory device are merely examples, and claimed subject matter is not so limited.

Figure 4:
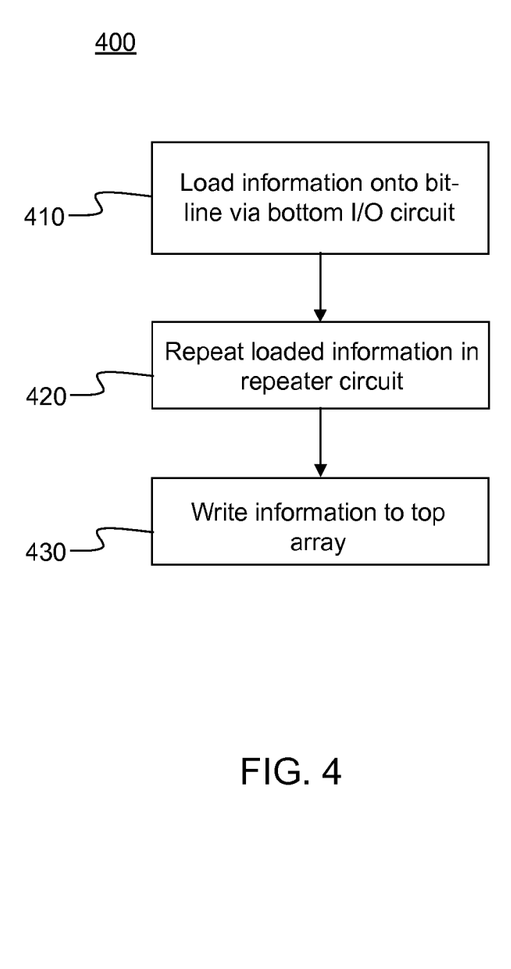
FIG. 4 is a flow diagram of a write process for memory, according to an embodiment.

FIG. 4 is a flow diagram of a process for accessing one or more memory locations of memory device 300, according to an embodiment. Such a process may comprise receiving a request to read or write from/to a particular memory location. Such a request may be provided by a memory controller, as described below, for example. Such a process may further comprise determining whether a memory access request is addressed to a lower sub-array 315 or an upper sub-array 310. Upon a determination that the memory access request is addressed to upper sub-array 310, then lower sense amplifier 350 may be activated to receive signals from lower bitline BL, and upper sense amplifier 365 may be activated to receive signals from upper bitline $BL_{up}$. However, upon a determination that the memory access request is addressed to lower sub-array 315, then lower sense amplifier 350 may be activated to receive signals from lower bitline BL while upper sense amplifier 365 may be de-activated, for example.

In a particular example, write process 400 may involve writing information to be stored in upper sub-array 310. During such a write process, precharge voltage levels of internal nodes of upper sense amplifier 365 and lower sense amplifier 350 may be maintained to reduce power consumption and improve write speed. Also during a write process, I/O ports of upper sense amplifier 365 operated by a sense-enable circuit (not shown) may isolated the upper sense amplifier from upper and lower bitlines. At block 410, signals representing such information may be loaded onto lower bitline BL via I/O ports of lower sense amplifier 350. Since such information is to be written to upper sub-array 310, signals representing the information may be transmitted from lower bitline BL to upper bitline $BL_{up}$ leaving lower sub-array 315 unchanged. In one implementation, such information may comprise address information indicating memory storage location in upper sub-array 310, for example. At block 420, SAR circuit 360 may receive signals representing information to be stored in upper sub-array 310 from upper bitline $BL_{up}$. Such signals may be amplified (e.g., strengthened) by SAR circuit 360 and placed back onto upper bitline $BL_{up}$. At block 430, such information may be written to one or more memory cells in upper sub-array 310. In an implementation, a repeat and/or amplification for a write process may be performed via an inverter (e.g., a fully driven repeater), whereas for a read process a repeat and/or amplification may be performed via a sense amplifier using a differential signal, for example.

Figure 5:
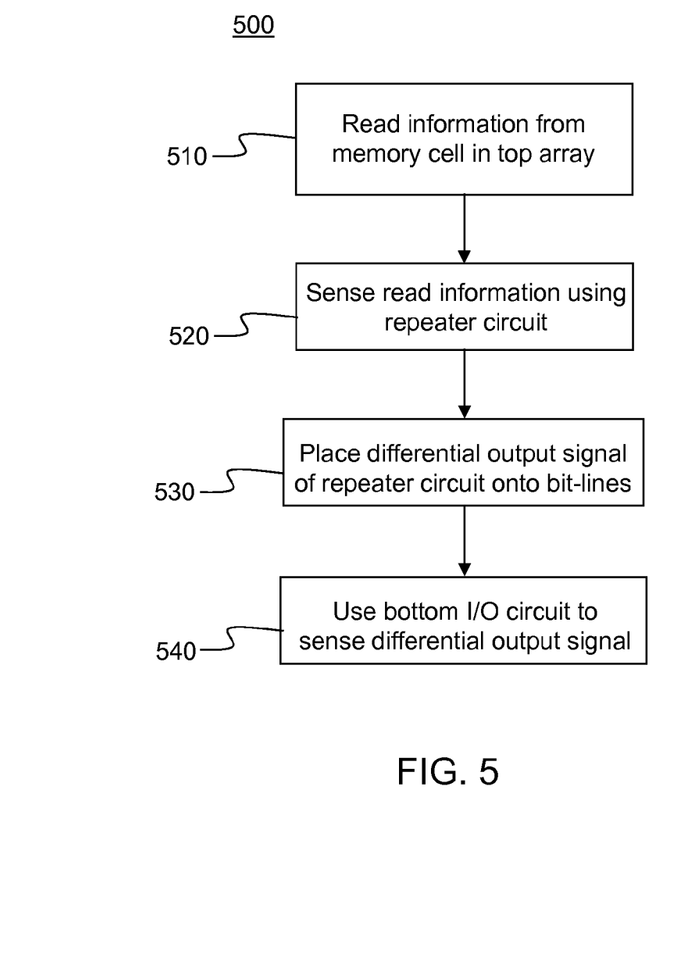
FIG. 5 is a flow diagram of a read process for memory, according to an embodiment.

FIG. 5 is a flow diagram of a read process 500 for memory device 300, according to an embodiment. In particular, at block 510, write process 500 includes reading information from upper sub-array 310, resulting in signals representing read information being loaded onto upper bitline $BL_{up}$. At block 520, SAR circuit 360 may receive such signals from upper bitline $BL_{up}$. At block 530, SAR circuit 360 may amplify the received signals and place the amplified signals onto lower bitline BL. At block 540, lower sense amplifier 350 may further amplify the signal provided by SAR circuit 360.

In a particular implementation, a read process may include reading information from lower sub-array 315, resulting in signals representing read information being loaded onto lower bitline BL. In such a process, SAR circuit 360 may be disabled and/or electronically isolated from lower memory portion 301. Lower sense amplifier 350 may receive the signals representing the read information and amplify the received signals.

Figure 6:
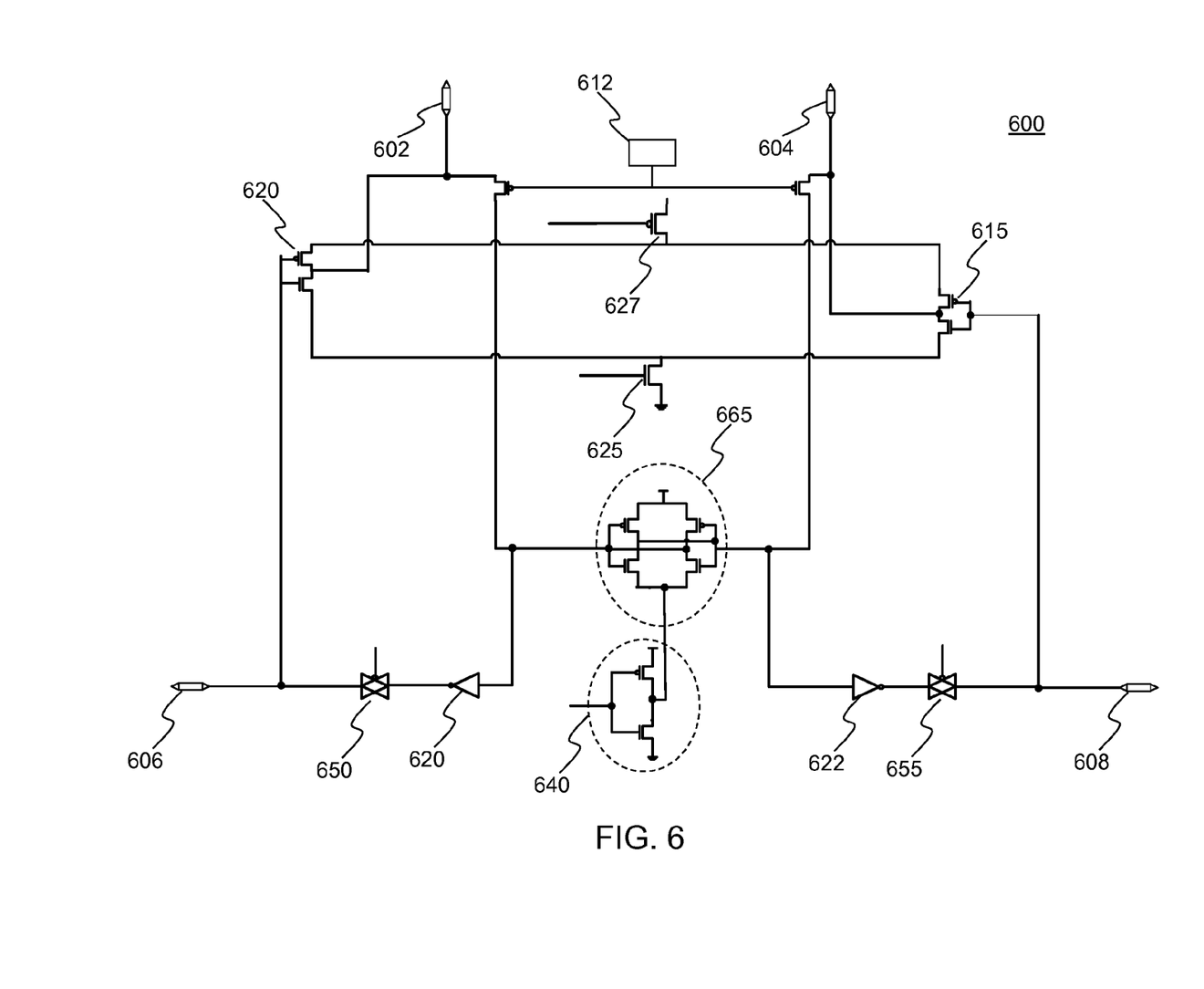
FIG. 6 is a schematic circuit diagram of a portion of memory, according to an embodiment.

FIG. 6 is a schematic circuit diagram of an SAR circuit 600, according to an embodiment. Such an SAR circuit may be similar to SAR circuit 360 shown in FIG. 3, for example. In particular, SAR circuit 600 may comprise a portion of memory device 300. Connection points 602 and 604 may connect SAR circuit 600 to upper precharge circuit 320 via upper bitline pair $BLB_{up}/BL_{up}$ while connection points 606 and 608 may connect SAR circuit 600 to lower sub-array 315 via upper bitline pair $BLB_{up}/BL_{up}$. SAR circuit 600 may comprise upper sense amplifier 665, which may be similar to upper sense amplifier 365 shown in FIG. 3, for example. In an implementation, upper sense amplifier 665 may be connected to upper sense-enable circuit 640 that may selectively enable or disable upper sense amplifier 665. Such enabling or disabling may be responsive, at least in part, to whether a pending memory access comprises a read or a write process. For example, upper sense-enable circuit 640 may disable upper sense amplifier 665 during a process of writing information to lower sub-array 315. On the other hand, upper sense-enable circuit 640 may enable upper sense amplifier 665 during a process of reading information from upper sub-array 310. In another example, upper sense-enable circuit 640 may disable upper sense amplifier 665 during a process of writing information to the upper sub-array. In an implementation, upper sense-enable circuitry may also comprise pass-gates 650 and 655. Such pass gates may operate based, at least in part, on a sense-enable signal for a sense amplifier. Upper sense amplifier 665 may be enabled during a read process that involves upper sub-array 310. A pass gate may allow a sense-enable signal to pass through to lower sub-array 315 in the case of a read that involves upper sub-array 310. A pass gate may also be used to isolate an upper portion of SAR circuit 600 from a lower bitline in the case of a read process that involves the lower bitlines.

In an embodiment, SAR circuit 600 may also comprise write-enable switches 625 and 627 to operate on upper bitline $BL_{up}$ and $BLB_{up}$, respectively. For example, such write-enable switches may be open or "off" during a process of reading from upper sub-array 310. Write-enable switches may also be open or "off" during a process of writing to lower sub-array 315, for example. SAR circuit 600 may include a bitline isolation circuit 612, comprising transistors, for example, that may be opened or closed to selectively isolate SAR circuit 600 from upper bitline pair $BLB_{up}/BL_{up}$. For example, such isolation may be selected during a process of reading information from lower sub-array 315. In another example, such isolation may be selected during a process of writing to either lower sub-array 315 or upper sub-array 310. Though other circuit configurations are possible, SAR circuit 600 may comprise inverters 620 and 622 associated with bitline isolation circuit 612. Of course, details of such a portion of a memory device are merely examples, and claimed subject matter is not so limited.

As mentioned above, SAR circuit 600 may comprise upper sense amplifier 665 to amplify (e.g., drive) signals on upper bitline $BL_{up}$, wherein such signals may result from a process of reading from an upper sub-array, such as upper sub-array 310, for example. SAR circuit 600 may also place amplified signals onto lower bitline BL. For example, sense amplifier input signals may be connected to upper bitlines, whereas sense amplifier output signals may be connected to lower bitlines through inverters and passgates 650 and 655 (see FIG. 6). Signals produced by the inverters and passgates, which may comprise output signals of sense amplifier 665 subsequent to an enable signal being activated, may be connected to lower bit lines. Output signals of sense amplifier 665 may mimic input signals, thus having the same values as those of upper bitlines, and be transferred/transmitted onto lower bitlines.

Figure 7:
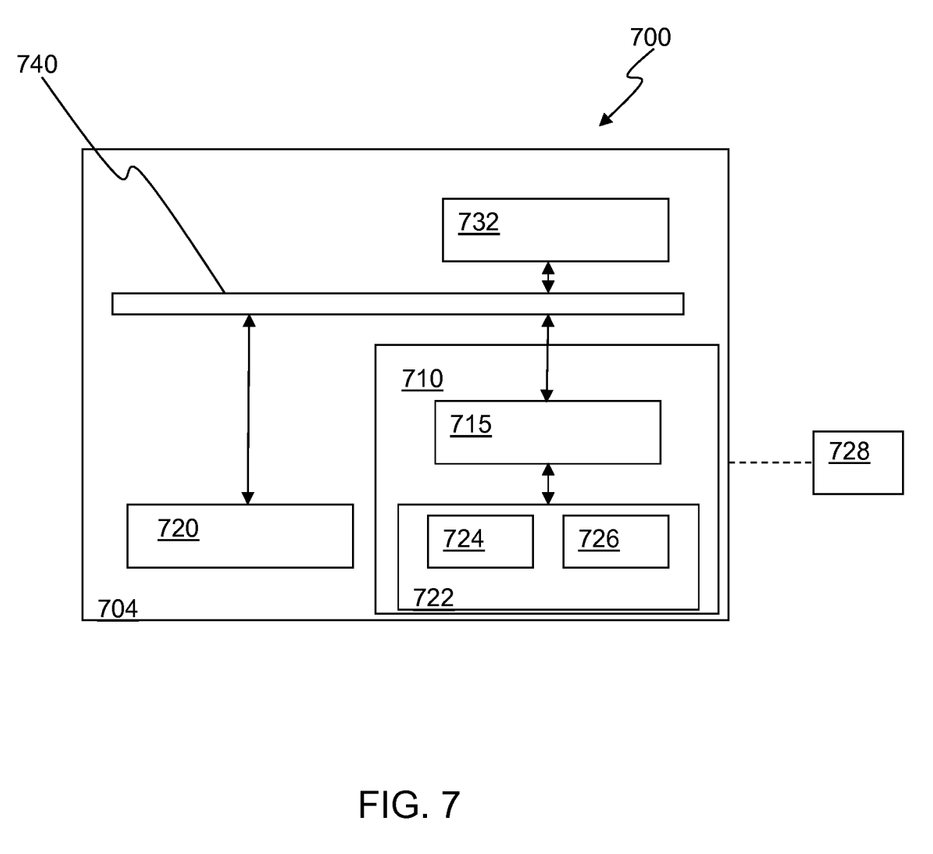
FIG. 7 is a schematic diagram of a computing system and a memory device, according to an embodiment.

FIG. 7 is a schematic view of a computing system and a memory device, according to an embodiment. Such a computing device may comprise one or more processors, for example, to execute an application and/or other code. For example, memory device 710 may comprise memory device 300 shown in FIG. 3. A computing device 704 may be representative of any device, appliance, or machine that may be configurable to manage memory device 710. Memory device 710 may include a memory controller 715 and a memory 722. By way of example but not limitation, computing device 704 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 700 may be implemented using or otherwise including hardware, firmware, software, or any combination thereof. Thus, by way of example but not limitation, computing device 704 may include at least one processing unit 720 that is operatively coupled to memory 722 through a bus 740 and a host or memory controller 715. Processing unit 720 is representative of one or more circuits configurable to perform at least a portion of a data computing procedure or process. By way of example but not limitation, processing unit 720 may include one or more processors, controllers, microprocessors, microcontrollers, application specific integrated circuits, digital signal processors, programmable logic devices, field programmable gate arrays, and the like, or any combination thereof. Processing unit 720 may include an operating system configured to communicate with memory controller 715. Such an operating system may, for example, generate commands to be sent to memory controller 715 over bus 740. Such commands may comprise read and/or write commands. In response to a write command, for example, memory controller 715 may provide a bias signal, such as a set or reset pulse to write information associated with the write command to a memory partition, for example. In an implementation, memory controller 715 may operate memory device 710, wherein processing unit 720 may host one or more applications and/or initiate write commands to the memory controller to provide access to memory cells in memory device 710, for example.

In one embodiment, a system may comprise a memory controller to operate a memory device. Such a memory device may include a first sub-array of memory cells which are addressable via a first bitline, a second sub-array of memory cells which are addressable via a second bitline, and an SAR circuit such as SAR circuit 360 shown in FIG. 3, for example. As explained in detail above, such an SAR circuit may electronically interconnect the first and second sub-arrays and/or sense signals on the second bitline resulting from a process of reading from the second sub-array, and place the sensed signals onto the first bitline. Such a system may further comprise a processor to host one or more applications and to initiate a process of reading from the second sub-array, for example.

Memory 722 is representative of any data storage mechanism. Memory 722 may include, for example, a primary memory 724 and/or a secondary memory 726. Primary memory 724 may include, for example, a random access memory, read only memory, etc. While illustrated in this example as being separate from processing unit 720, it should be understood that all or part of primary memory 724 may be provided within or otherwise co-located/coupled with processing unit 720.

Secondary memory 726 may include, for example, the same or similar type of memory as primary memory and/or one or more data storage devices or systems, such as, for example, a disk drive, an optical disc drive, a tape drive, a solid state memory drive, etc. In certain implementations, secondary memory 726 may be operatively receptive of, or otherwise configurable to couple to, a computer-readable medium 728. Computer-readable medium 728 may include, for example, any medium that can carry and/or make accessible data, code, and/or instructions for one or more of the devices in system 700.

Computing device 704 may include, for example, an input/output 732. Input/output 732 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 732 may include an operatively configured display, speaker, keyboard, mouse, trackball, touch screen, data port, etc.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. An apparatus comprising a memory device, the apparatus comprising:
 a first sub-array of memory cells;
 a second sub-array of memory cells;
 a first bitline configured to carry signals to and from the first sub-array of memory cells;
 a second bitline configured to carry signals to and from the first and second sub-arrays of memory cells;
 a first sense amplifier configured to amplify signals from the first bitline;
 a sense amplifier repeater (SAR) circuit configured to amplify signals on the first bitline resulting from a process of reading from the first sub-array, the SAR circuit further comprising a second sense amplifier configured to amplify signals from the second bitline; and
 an isolation circuit configured to isolate the first and second sense amplifiers during a write access to the first and second sub-arrays of memory cells.

2. The apparatus of claim 1, wherein the first sub-array is configured to pass through signals directed to and from the second sub-array.

3. The apparatus of claim 1, wherein the isolation circuit comprises transistors.

4. The apparatus of claim 1, wherein the memory device comprises a static random access memory (SRAM).

5. A method of operating a memory device, the method comprising:
   using a first bitline to carry signals for a first sub-array of memory cells;
   using a second bitline to carry signals for a second sub-array of memory cells;
   amplifying, with a first sense amplifier, signals from the first bitline;
   amplifying, with a second sense amplifier, signals from the second bitline;
   amplifying, with a sense amplifier repeater circuit, signals on the first bitline resulting from a process of reading from the first sub-array; and
   isolating the first and second sense amplifiers during a write access.

6. The method of claim 5, further comprising transmitting read and/or write signals for the second sub-array through the first sub-array.

7. The method of claim 5, further comprising performing isolation with transistors.

8. The method of claim 5, wherein the memory device comprises a static random access memory (SRAM).

9. A system comprising:
   a memory controller configured to operate a memory device, the memory device comprising:
      a first sub-array of memory cells;
      a second sub-array of memory cells;
      a first bitline configured to carry signals to and from the first sub-array of memory cells;
      a second bitline configured to carry signals to and from the first and second sub-arrays of memory cells;
      a first sense amplifier configured to amplify signals from the first bitline;
      a sense amplifier repeater (SAR) circuit configured to amplify signals on the first bitline resulting from a process of reading from the first sub-array, the SAR circuit further comprising a second sense amplifier configured to amplify signals from the second bitline; and
      an isolation circuit configured to isolate the first sense amplifier during a write access to the first and second sub-arrays of memory cells; and
   a processor configured to host one or more applications and to initiate the process of reading from the first sub-array.

10. The system of claim 9, wherein the first sub-array is configured to pass through signals directed to and from the second sub-array.

11. The system of claim 9, wherein the isolation circuit comprises transistors.

12. The system of claim 9, wherein the memory device comprises a static random access memory (SRAM).

* * * * *